United States Patent [19]
Sher et al.

[11] Patent Number: 5,841,714
[45] Date of Patent: Nov. 24, 1998

[54] SUPERVOLTAGE CIRCUIT

[75] Inventors: Joseph C. Sher; Todd A. Merritt, both of Boise, Id.

[73] Assignee: Micron Technology, Inc., Boise, Id.

[21] Appl. No.: 734,504

[22] Filed: Oct. 21, 1996

[51] Int. Cl.[6] ................................. G11C 7/00
[52] U.S. Cl. ................... 365/201; 365/189.09
[58] Field of Search ............... 327/77; 365/201, 365/189.09

[56] References Cited

U.S. PATENT DOCUMENTS

| | | | |
|---|---|---|---|
| 4,970,727 | 11/1990 | Miyawaki et al. | 371/21.3 |
| 5,019,772 | 5/1991 | Dreibelbis et al. | 324/158 |
| 5,212,442 | 5/1993 | O'Toole et al. | 324/158 R |
| 5,367,491 | 11/1994 | Han et al. | 365/201 |
| 5,424,990 | 6/1995 | Ohsawa | 365/201 |
| 5,467,306 | 11/1995 | Kaya et al. | 365/185.2 |
| 5,493,532 | 2/1996 | McClure | 365/201 |
| 5,627,485 | 5/1997 | Casper et al. | 327/77 |

FOREIGN PATENT DOCUMENTS

| | | |
|---|---|---|
| 0367115 | 5/1990 | European Pat. Off. . |
| 0632282 | 1/1995 | European Pat. Off. . |

*Primary Examiner*—David Nelms
*Assistant Examiner*—Michael Tran
*Attorney, Agent, or Firm*—Schwegman, Lundberg, Woessner & Kluth, P.A.

[57] ABSTRACT

A supervoltage circuit has been described which uses a resistor divider as an input stage. The resistor divider decreases the dependancy of the supervoltage trip point on transistor threshold voltages (Vt). The stability of supervoltage trip point is significantly increased over traditional supervoltage circuits using diode connected transistors as an input stage. The supervoltage circuit can be included in any integrated circuit including memory devices.

21 Claims, 6 Drawing Sheets

SUPERVOLTAGE CIRCUIT

TECHNICAL FIELD OF THE INVENTION

The present invention relates generally to integrated circuits and in particular the present invention relates to a supervoltage circuit provided on the integrated circuit.

BACKGROUND OF THE INVENTION

Integrated circuits, as with any manufactured product, are susceptible to defects. These defects can often be identified through 'burn-in' testing conducted at specification extremes. This testing assists in identifying infant failures by forcing the integrated circuit to operate at temperature and voltage extremes.

Alternate testing can be conducted on an integrated circuit to test application specific features. These can be tests conducted at both normal operating voltages and burn-in level voltages. Further, these alternate tests are typically conducted by the manufacturer and not intended to be used by a purchaser of the integrated circuit. As such, an electronic key is typically provided to allow the manufacturer to initiate an application-specific test mode. In integrated memory circuits, one of the external input pins is typically used to access the electronic key. By placing a voltage on the input pin which is a predetermined level above the maximum specified supply voltage, the memory circuit enters a specific test mode. This voltage level is referred to as a supervoltage. A supervoltage circuit is provided to detect when a supervoltage is presented on the external input pin.

Traditional supervoltage circuits use a series of transistors in establishing a trip point for initiating a test mode. The supervoltage trip point, therefore, is susceptible to changes in transistor threshold voltages (Vt). Vt can change substantially between manufacturing lots as a result of fabrication variables. Finally, supervoltage trip point errors resulting from Vt changes can produce erroneous test results.

For the reasons stated above, and for other reasons stated below which will become apparent to those skilled in the art upon reading and understanding the present specification, there is a need in the art for an integrated circuit supervoltage circuit which is less susceptible to variations in fabrication and operating conditions.

SUMMARY OF THE INVENTION

The above-mentioned problems with integrated circuit supervoltage circuits and other problems are addressed by the present invention and which will be understood by reading and studying the following specification. A supervoltage circuit is described which uses a resistor divider as an input stage.

In particular, the present invention describes a supervoltage circuit comprising a reference voltage circuit for producing a reference voltage, a resistor divider input circuit for receiving an input voltage and producing an output voltage, and a compare circuit for comparing the reference voltage and the output voltage and producing an output signal in response thereto.

In another embodiment, a system is described which comprises a processor connected to a memory device for testing the memory device. The memory device comprises an input for receiving an input voltage, a test mode circuit for initiating a test in response to the input voltage, and a supervoltage circuit. The supervoltage circuit comprises a reference voltage circuit for producing a reference voltage, a resistor divider input circuit connected to the input for receiving the input voltage and producing an output voltage, and a compare circuit coupled to the test mode circuit for comparing the reference voltage and the output voltage and producing an output signal in response thereto.

In yet another embodiment, a method of initiating a test operation in an integrated circuit device is described. The method comprises the steps of providing a voltage on an input connection, generating an internal voltage using a resistor divider circuit coupled to the input connection, comparing the internal voltage to a reference voltage, producing an output signal when the internal voltage exceeds the reference voltage by a predetermined level, and initiating a test operation in response to the output signal.

DETAILED DESCRIPTION OF THE INVENTION

In the following detailed description of the preferred embodiments, reference is made to the accompanying drawings which form a part hereof, and in which is shown by way of illustration, specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 1:
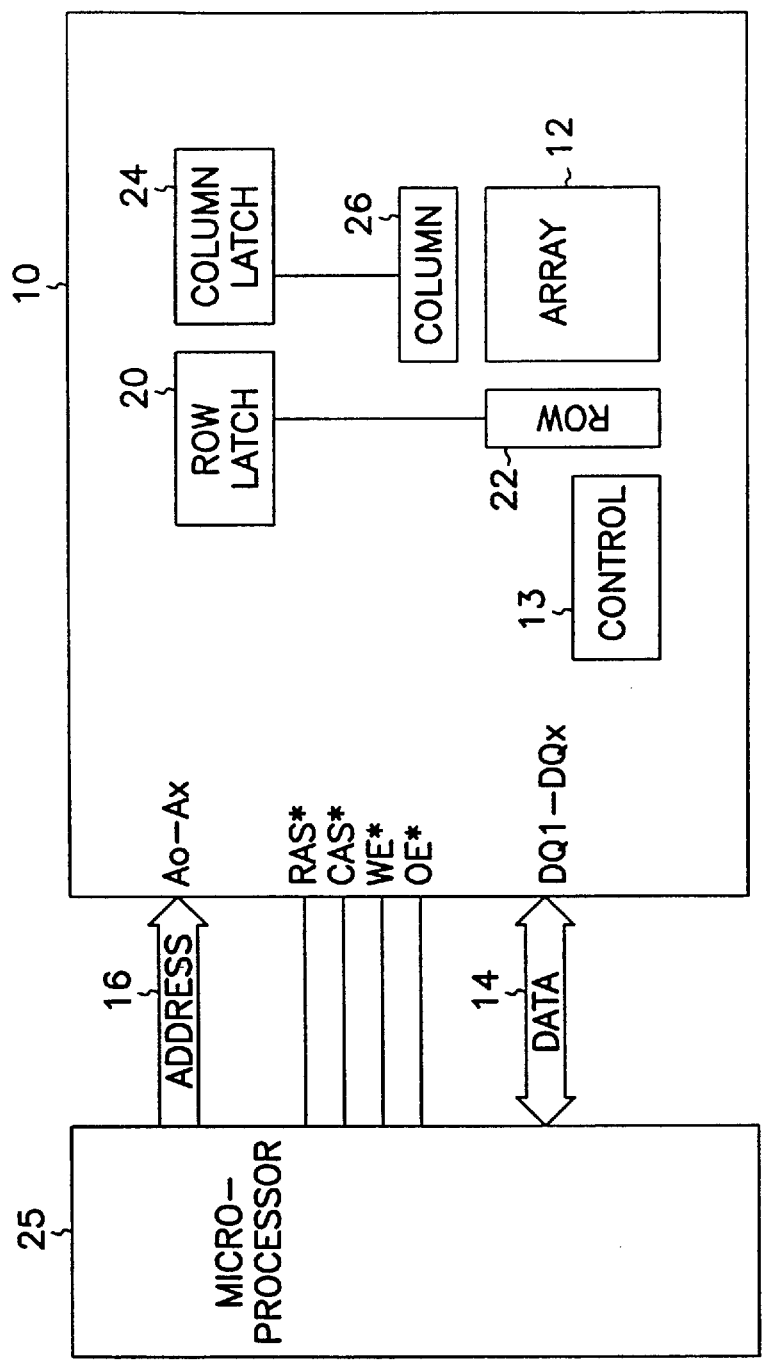
FIG. 1 is a block diagram of a memory device incorporating the present invention.

FIG. 1 illustrates a block diagram of a DRAM 10 incorporating the present invention. A detailed description of the memory has been left out of FIG. 1 to focus on the features more directly relevant to the present invention. Such omitted detailed elements of the operation of DRAMs and their applications are known to one skilled in the art. While a DRAM is illustrated, the functions and methods described below are equally applicable to types of memory devices, including but not limited to multi-port memories, synchronous dynamic random access memories (SDRAM) and static random access memories (SRAM).

The DRAM 10 is accessed through address bus 16, row and column address strobe signals RAS* and CAS*, write enable signal WE*, an output enable signal OE* and by using other conventional control signals (not shown) which are known to one skilled in the art. Row address latch/buffer 20 and row decoder 22 receive and decode a row address from a row address signal provided on address lines A0–Ax, and address a corresponding row of the DRAM array 12. Likewise, column address latch/buffer 24 and column decoder 26 receive and decode a column address from a column address signal provided on address lines A0–Ax, and address the corresponding column of the DRAM array 12.

Data bus 14 receives data during a write cycle from the microprocessor 25 for writing to DRAM array 12. Data stored in the DRAM 10 can be transferred during a read cycle on bus 14. Control logic 13 is used to control the many available functions of the DRAM. Various control circuits and signals not detailed herein initiate and synchronize the DRAM operation as known to those skilled in the art.

Some of the inputs and outputs of DRAM 10 used to communicate with microprocessor 25 are described as follows. Write enable input (WE*) is used to select a read or write cycle when accessing the DRAM. To read the DRAM array, the WE* line is high when CAS* falls. If the WE* line is low when CAS* falls, the DRAM is written to. Row address strobe (RAS*) input is used to clock in the row address bits. In standard memories, the RAS* also acts as the master chip enable and must fall for the initiation of any DRAM array or transfer operation. Column address strobe (CAS*) input is used to clock in the column address bits.

Address input lines A0–Ax are used to identify a row and column address to select memory cells of DRAM array 12, as described above. DRAM data input/output lines DQ1–DQx provide data input and output for the DRAM array 12. As stated above, the DRAM description has been simplified for purposes of illustrating the present invention and is not intended to be a complete description of all the features of a DRAM.

Supervoltage Circuitry

Figure 2:
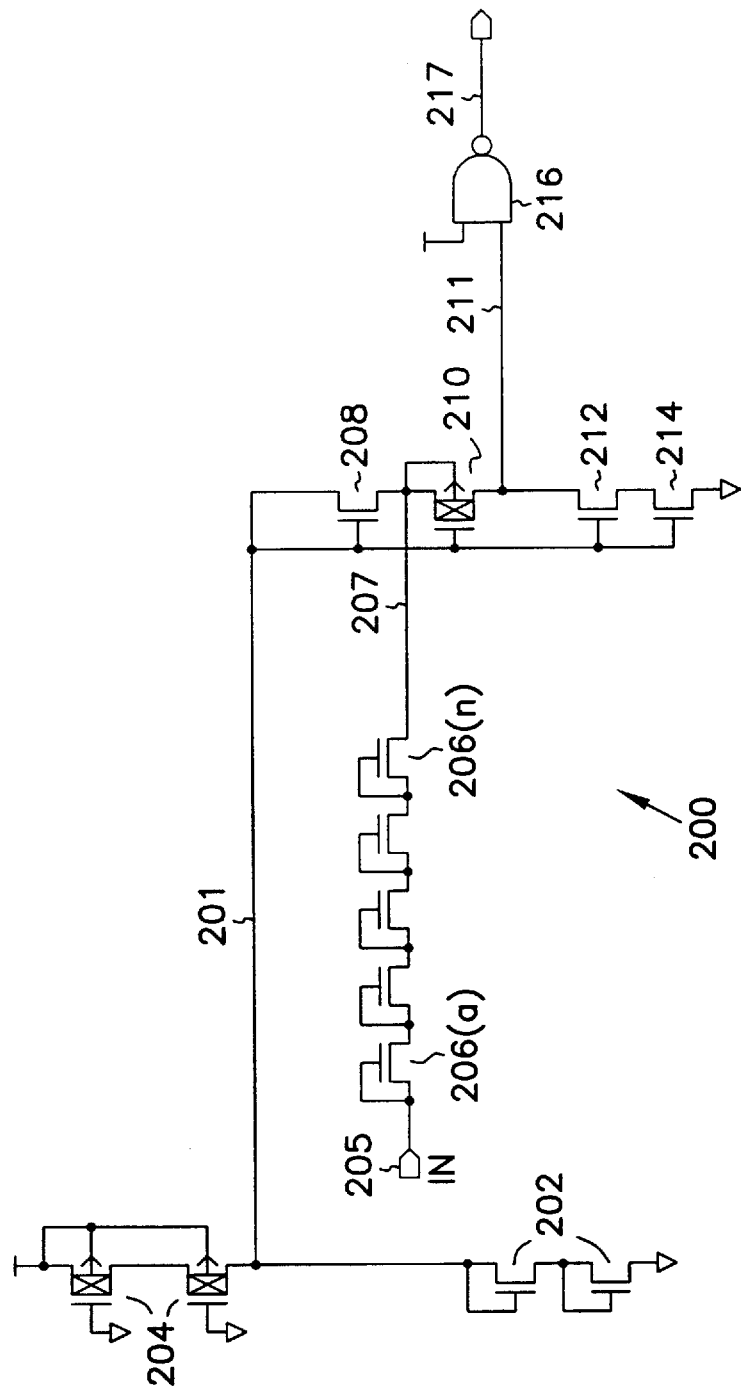
FIG. 2 is a schematic diagram of a prior art supervoltage circuit.

FIG. 2 illustrates a prior art supervoltage circuit 200. The supervoltage circuit has a reference voltage node 201 for providing a reference voltage. The reference voltage is established by n-channel transistors 202 and p-channel transistors 204. The reference voltage is coupled to the gate and drain of diode connected transistor 208. An input node 205 is connected to diode coupled n-channel transistors 206(a)–(n). Transistor 206(n) is connected to the source of transistor 208. The input node 205 can be any external input node or pin. For example, one or more of the address input lines can be used to receive a supervoltage in a memory device.

In operation, p-channel transistor 210 is normally turned off because node 201 is greater than node 207. That is, without a supervoltage provided on node 207 from transistor 206(n), transistor 210 will not conduct current. Transistors 212 and 214, however, are activated by the reference voltage on node 201 and pull node 211 low. The output of NAND gate 216, therefore, is normally high. It will be understood that a voltage provided on input 205 is decreased by successive transistor threshold drops of transistors 206(a)–(n). If node 207 exceeds the reference voltage by a p-channel threshold voltage, transistor 210 is activated and the output of NAND gate 216 transitions low. The point of activation of transistor 210 is referred to as the trip point of the supervoltage circuit.

It will be appreciated by those skilled in the art that the voltage drop produced by the series of diode connected transistors 206(a)–(n) is susceptible to process variations. Transistor threshold voltage (Vt) variations of several hundred millivolts between integrated circuit lots can be experienced. The voltage fluctuation of node 207, for a given input voltage, is dependant upon Vt variations.

Because the voltage at node 207 depends greatly upon Vt, a larger input voltage at node 205 will be needed when Vt increases. This can cause the supervoltage level to be dangerously close to or over the junction breakdown voltage of transistors 206(a)–(n). Conversely, if the n-channel Vt decreases, the voltage required at node 205 will decease. As a result, normal overshoot voltages provided on input 205 can inadvertently trip the supervoltage detector causing invalid and inaccurate testing of the integrated circuit device. In either case, the device under test could get permanently damaged.

Improved Supervoltage Circuitry

Figures 3A, 3B:
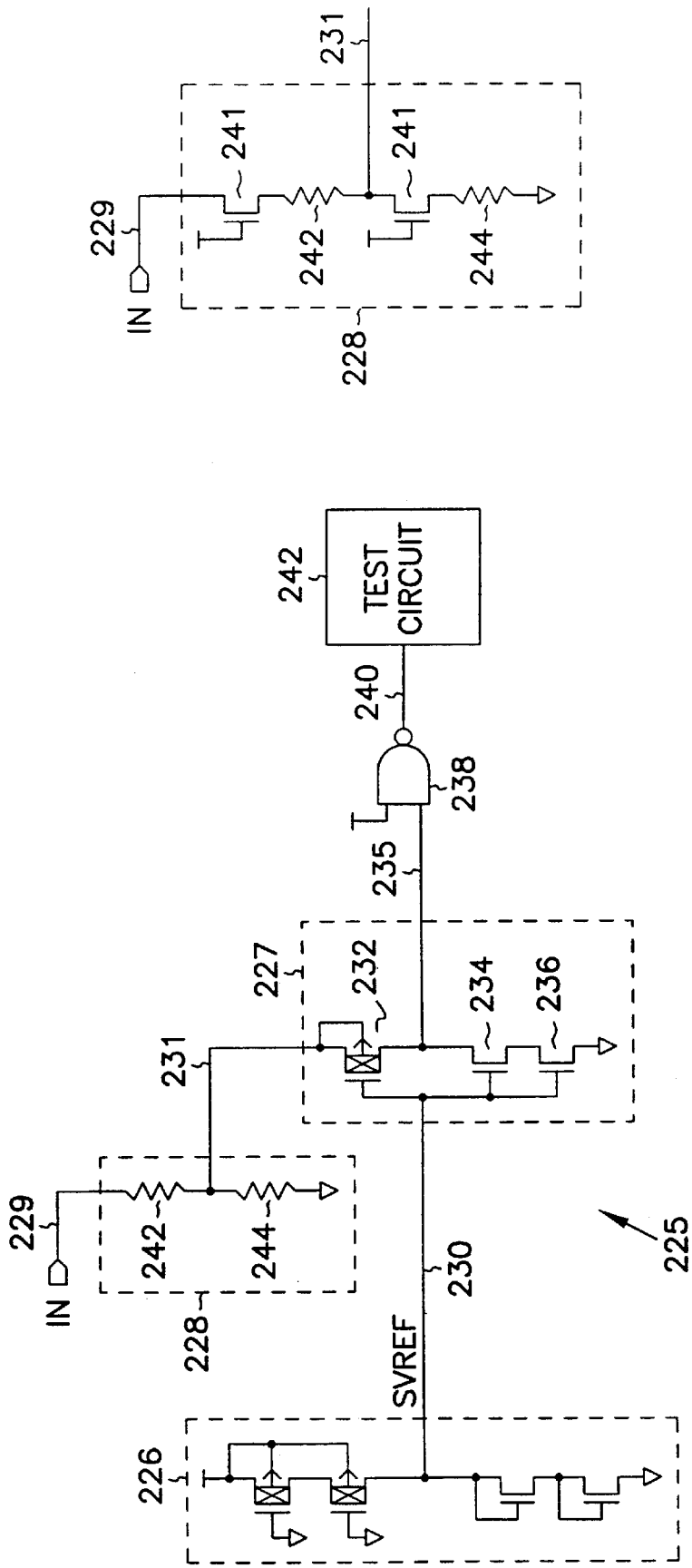
FIG. 3A is a schematic diagram of a supervoltage circuit of the present invention.
FIG. 3B is a schematic of an alternate circuit of the supervoltage circuit of FIG. 3A.

Referring to FIG. 3A, a supervoltage circuit 225 is described which has a reduced susceptibility to variations which effect transistor threshold voltage levels. The supervoltage circuit includes a reference voltage circuit 226 which provides a reference voltage on node 230. A voltage divider embodied as a resistor divider input circuit 228 is coupled to input node, or connection, 229 and p-channel transistor 232. Resistor circuit 242 is connected between the input node 229 and an internal node 231, and resistor circuit 244 is connected between the internal node 231 and a bias voltage node (ground). It will be appreciated by those skilled in the art that each of the resistors 242 and 244 of the resistor divider 228 can comprise a plurality of resistors. Further, the resistor divider input stage 228 can be replaced with a circuit having a first half in place of resistor circuit 242 and a second half in place of resistor circuit 244. The first and second halves each having an equal number and type of electrical components. That is, the two halves can each contain an equal number of resistors and/or transistors 241 functioning as a resistor, such as activated long-L transistors, see FIG. 3B. By matching the number and type of components, the effects of fabrication variables from lot-to-lot can be reduced. In addition, the effects of environmental variables such as temperature can also be reduced by using matching halves. It will be appreciated that in the preferred embodiment the resistor divider 228 does not contain diode circuits.

A compare circuit 227 compares a voltage provided on node 231 with the reference voltage provided on node 230 and produces an output signal on node 235 in response to the two input voltages. An output circuit, NAND gate 238, produces an output signal on line 240 in response to the compare circuit. It is contemplated that any type of output circuit can be used, including variations in logic circuitry. Test mode circuitry, generally referred to as test circuit 242, is provided to initiate specific test operations in response to receiving a supervoltage on input 229 as indicated by a low transition of a signal provided on node 240.

In operation, n-channel transistors 234 and 236 are normally activated by the reference voltage coupled to gate connections of the transistors and pull node 235 low. The output 240 of NAND gate 238 is therefore normally high. When a voltage on node 231 exceeds the reference voltage provided on node 230 by a p-channel threshold voltage, transistor 232 is activated and node 235 is pulled high, referred to herein as the supervoltage "trip point". The output of NAND gate 240 transitions low in response to a high signal transition on node 235. Test circuit 242 is used to initiate a test operation in response to the low transition on node 240.

The supervoltage circuit of FIG. 3A uses a resistor divider 228 for the input stage. It will be appreciated by those skilled in the art that transistor Vt changes do not affect the resistor divider in the same manner as the diode connected transistors 206 of FIG. 2. Further, the voltage at node 231 remains constant over temperature changes for a given voltage provided on input node 229. That is, resistors 242 and 244 have the same temperature characteristics such that the resistance of both resistors change in the same direction due to changes in temperature. The effects of temperature, therefore, are canceled and the ratio of the voltage divider remains constant.

Figure 4:
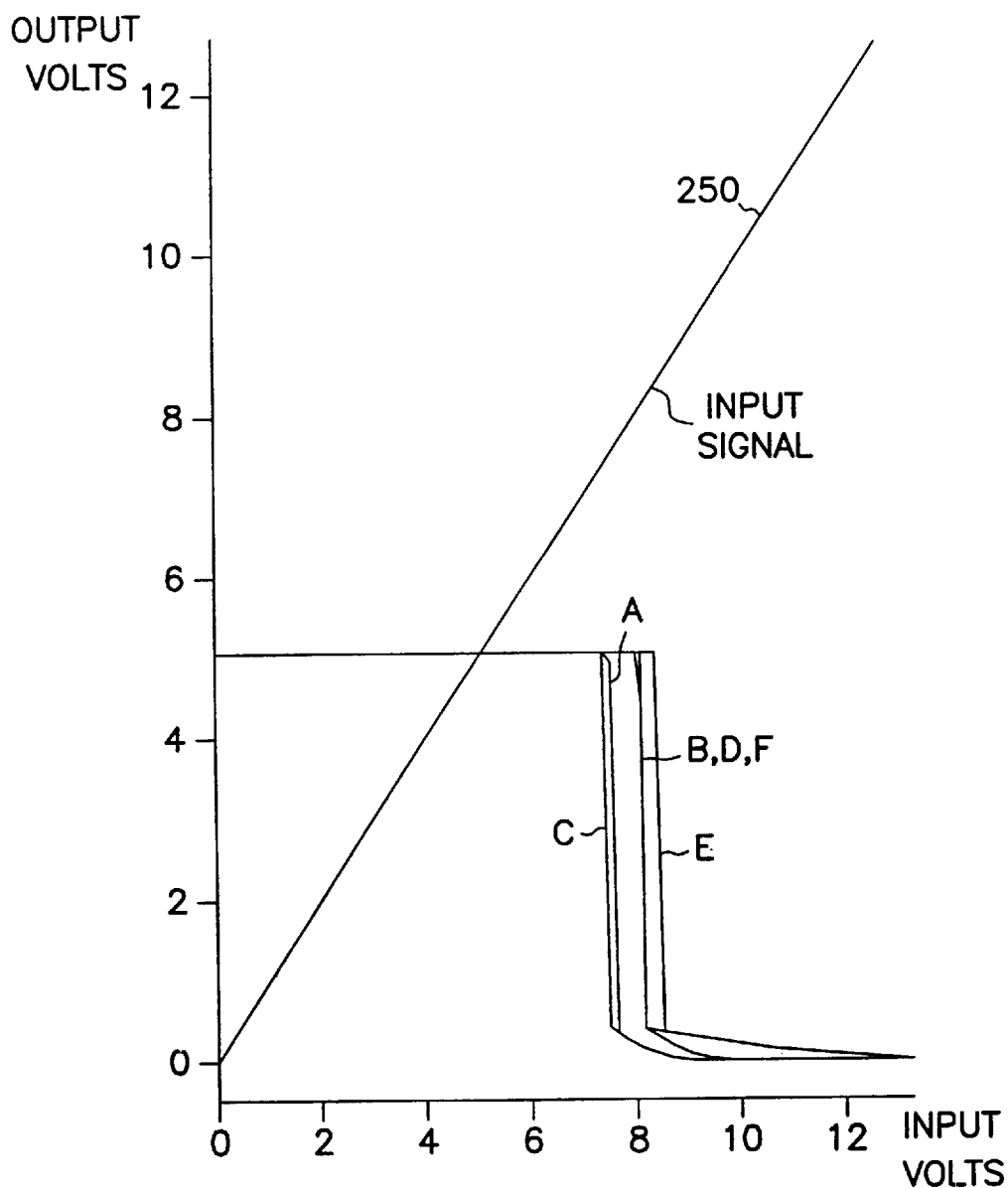
FIG. 4 is a graph comparing the operation of the circuits of FIGS. 2 and 3A.
Figure 5:
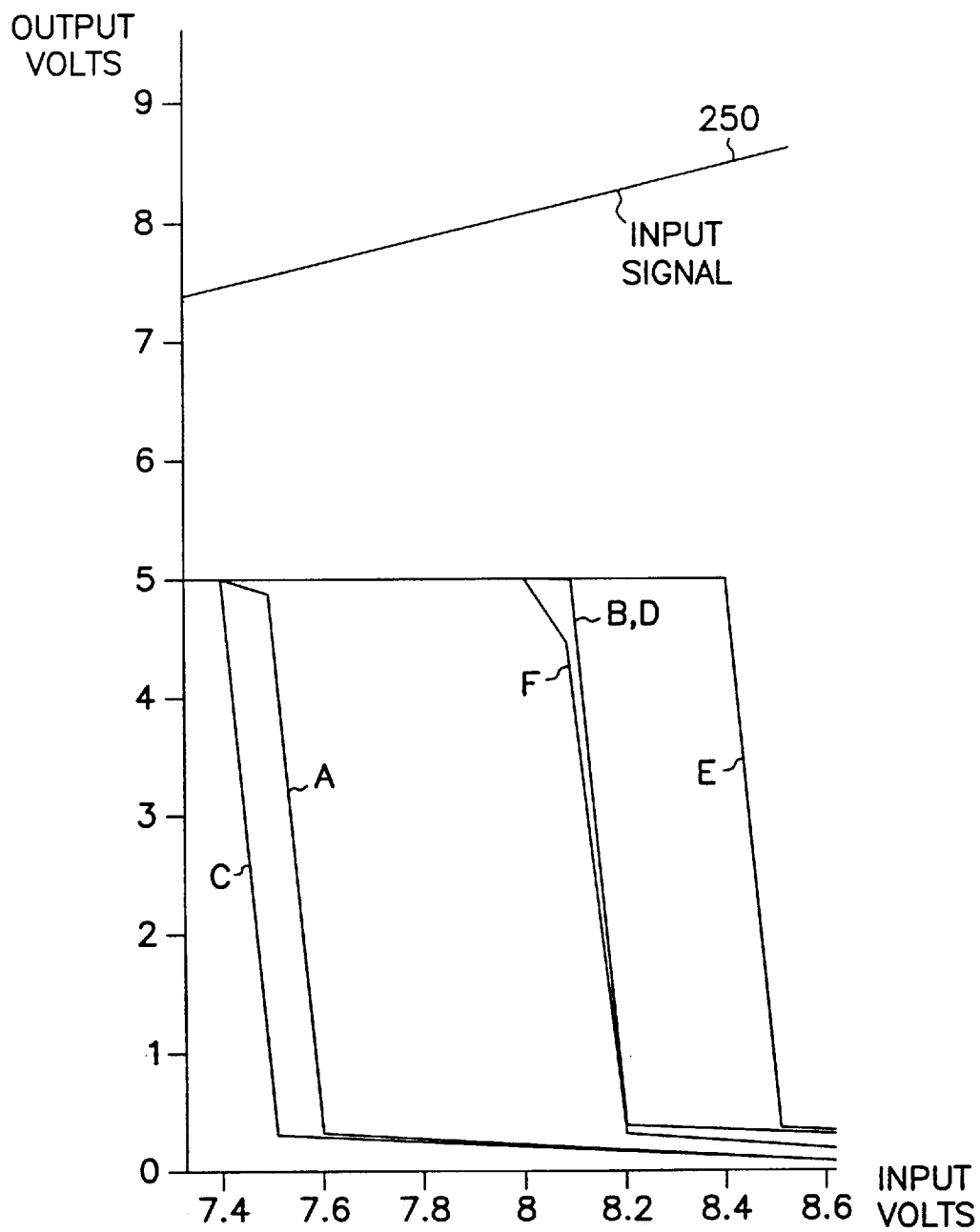
FIG. 5 is an enlarged view of the graph of FIG. 4.

FIGS. 4 and 5 illustrate the operation of the supervoltage circuits of FIGS. 2 and 3A according to an HSPICE simulation. The graphs of FIGS. 4 and 5 illustrate the output voltage for output signals A–F (nodes 217 and 240) on the Y-axis and the voltage scale for the input signal 250 on the X-axis. Each circuit is operated using a 5 volt power supply (Vcc) and a −1.2 Vbb (substrate voltage). The input signal provided on both nodes 205 and 229 is illustrated as line 250. The output signals of NAND gates 216 and 238 are illustrated as transitioning from a high state to a low state (trip point) in response to the input signal. FIG. 5 is an enlarged view of the region of FIG. 4 which shows the output signal transitions in greater detail.

Lines A, B and C illustrate the output of NAND gate 216 for circuits having three different transistor threshold voltages, Vt. Line A represents the output at a nominal Vt of 0.7 volts, line B represents the output at a 100 millivolt increase in Vt above the nominal Vt, and line C represents the output at a 100 millivolt decrease in Vt below the nominal Vt. The trip point range of the supervoltage circuit of FIG. 2 is 706 millivolts. That is, a 706 millivolt differential in input supervoltage is experienced over variations in Vt.

Lines D, E and F illustrate the output of NAND gate 238 for circuits having three different threshold voltages, Vt. Line D represents the output at the nominal Vt of 0.7 volts, line E represents the output at a 100 millivolt increase in Vt above the nominal Vt, and line F represents the output at a 100 millivolt decrease in Vt below the nominal Vt. The trip point range of the supervoltage circuit of FIG. 3A is 289 millivolts, a reduction of 59% over the operation of the supervoltage circuit using diode connected transistors. The reduced supervoltage trip point range significantly improves the supervoltage circuit of the present invention. For example, using a regulated supply voltage of 2.7 volts and −0.9 volts of Vbb, the circuit of FIG. 2 resulted in a 701 millivolt trip point shift over ±100 millivolt changes in Vt. The supervoltage trip point shift of the present invention using the same operating condition resulted in a range of 196 millivolts.

The nominal trip point of the circuit of FIG. 2, having a Vt of 0.7 Volts, changes 600 millivolts over a regulated voltage supply range of 2.7 to 5 volts. Similarly, the nominal trip point of the circuit of FIG. 3A, having a Vt of 0.7 Volts, changes 900 millivolts over a regulated voltage supply range of 2.7 to 5 volts. Thus, the supervoltage circuit of the present invention is more stable over changes in Vt, but has a greater shift in trip point over supply voltage variations.

Enable Circuit

Figure 6:
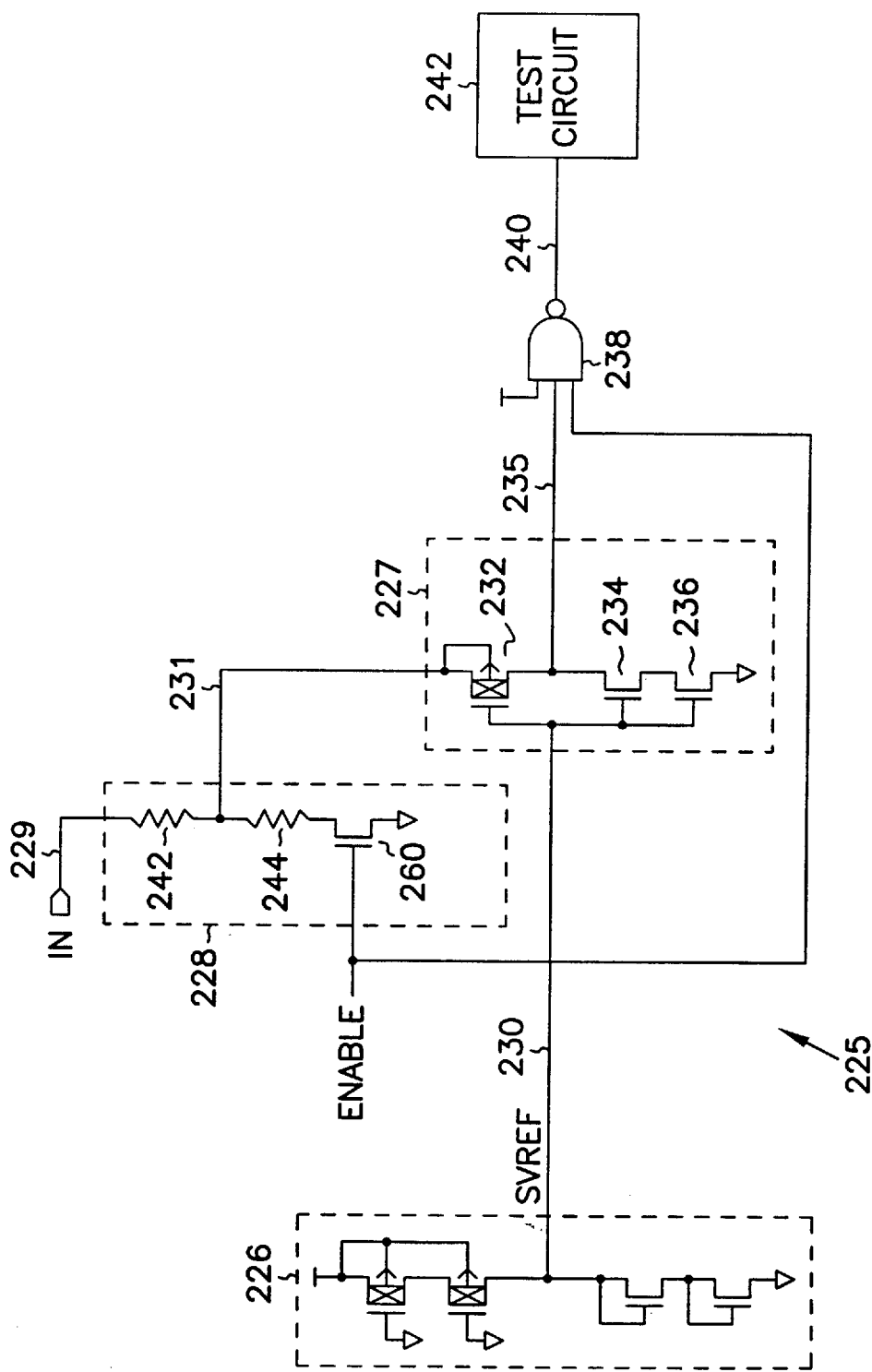
FIG. 6 is a schematic diagram of a supervoltage circuit of the present invention including an enable circuit.

Resistor divider circuit 228 provides a permanent conductive path from the input 229 to ground or a reference potential. This current path can cause problems meeting leakage current specifications for input connections. The supervoltage circuit of FIG. 3A, therefore, can be modified to include an enable circuit which comprises an n-channel transistor 260 and an additional input to NAND gate 238, see FIG. 6. The n-channel transistor eliminates current leakage path from the input node through the resistor divider circuit 228.

Transistor 260 is illustrated as located between the resistor divider and ground, but can be located in any position to interrupt current flow through the resistor divider circuit. The gate connection of transistor 260 is coupled to an Enable signal which is activated prior to initiating a test operation. For example, the Enable signal can be activated in response to a write-CAS*-before-RAS* (WCBR) operation in a DRAM. It is known to those skilled in the art that a WCBR is an illegal memory state. Thus, the resistor divider circuit will be disabled during normal operations, but can be enabled for testing.

NAND gate 238 can be modified to receive the Enable signal as an additional input to insure that an erroneous signal will not be provided on node 240 when the resistor divider circuit is disabled. It will be appreciated by those skilled in the art that any type of enable circuit can be provided which reduces or eliminated current through the resistor divider circuit during normal memory operations.

CONCLUSION

A supervoltage circuit has been described which uses a resistor divider as an input stage. The resistor divider decreases the dependancy of the supervoltage trip point on transistor threshold voltages (Vt). The stability of supervoltage trip point is significantly increased over traditional supervoltage circuits using diode connected transistors as an input stage. The supervoltage circuit can be included in any integrated circuit including, but not limited to, DRAM, SRAM, SDRAM, ATM Switches, Multiport Memory devices, VRAM.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A supervoltage circuit comprising:
   a reference voltage circuit for producing a reference voltage;
   a resistor divider input circuit for receiving an input voltage and producing an output voltage, the resistor divider circuit operates as a voltage divider such that the output voltage remains constant over an operating temperature range; and
   a compare circuit for comparing the reference voltage and the output voltage and producing an output signal in response thereto.

2. The supervoltage circuit of claim 1 further comprising an output stage coupled to the compare circuit for producing a second output signal.

3. A supervoltage circuit comprising:
   a reference voltage circuit for producing a reference voltage;
   a resistor divider input circuit for receiving an input voltage and producing an output voltage;
   a compare circuit for comparing the reference voltage and the output voltage and producing an output signal in response thereto; and
   a test circuit electrically coupled to the compare circuit for initiating a test in response to the input voltage.

4. A supervoltage circuit comprising:
   a reference voltage circuit for producing a reference voltage;

a resistor divider input circuit for receiving an input voltage and producing an output voltage; and a compare circuit for comparing the reference voltage and the output voltage and producing an output signal in response thereto, the resistor divider input circuit comprises:
   a first resistor having a first node connected to receive the input voltage; and
   a second resistor having a first node connected to a second node of the first resistor, and a second node coupled to a second reference voltage connection.

5. The supervoltage circuit of claim 4 further comprising an enable circuit coupled to the resistor divider circuit for preventing current flow through the resistor divider circuit during a period when the supervoltage circuit is inactivated.

6. A supervoltage circuit comprising:
   a reference voltage circuit for producing a reference voltage;
   a resistor divider input circuit for receiving an input voltage and producing an output voltage, the resistor divider input circuit comprises a first resistor having a first node connected to receive the input voltage, and a second resistor having a first node connected to a second node of the first resistor, and a second node coupled to a second reference voltage connection;
   a compare circuit for comparing the reference voltage and the output voltage and producing an output signal in response thereto; and
   an enable circuit coupled to the resistor divider circuit for preventing current flow through the resistor divider circuit during a period when the supervoltage circuit is inactivated,
   the enable circuit comprises a transistor coupled between the second node of the second resistor and the second reference voltage connection.

7. The supervoltage circuit of claim 1 further comprising an enable circuit coupled to the resistor divider circuit for preventing current flow through the resistor divider circuit during a period when the supervoltage circuit is inactivated.

8. A supervoltage circuit comprising:
   a reference voltage circuit for producing a reference voltage;
   a resistor divider input circuit for receiving an input voltage and producing an output voltage;
   a compare circuit for comparing the reference voltage and the output voltage and producing an output signal in response thereto; and
   a test mode circuit connected to receive the output signal and initiate a test in response thereto.

9. An integrated supervoltage circuit comprising:
   a reference voltage circuit for producing a reference voltage;
   an input node;
   an internal node;
   a voltage divider input circuit having first and second halves connected in series, the first half is connected between the input node and the internal node, and the second half is connected between the internal node and a bias voltage node; the first and second halves of the voltage divider input circuit each have an equal number and type of electrical components, such that a voltage provided on the input node is divided and provided as an output voltage on the internal node; and
   a compare circuit connected to the reference voltage circuit and the internal node for comparing the reference voltage and the output voltage on the internal node and producing an output signal in response thereto.

10. The integrated supervoltage circuit of claim 9 wherein the first and second halves of the voltage divider input circuit each comprise a resistor.

11. A memory device comprising:
   an input for receiving an input voltage;
   a test mode circuit for initiating a test in response to the input voltage; and
   a supervoltage circuit comprising:
      a reference voltage circuit for producing a reference voltage;
      a resistor divider input circuit connected to the input for receiving the input voltage and producing an output voltage;
      a compare circuit coupled to the test mode circuit for comparing the reference voltage and the output voltage and producing an output signal in response thereto.

12. The memory device of claim 11 wherein the resistor divider input circuit comprises:
   a first resistor having a first node connected to the input; and
   a second resistor having a first node connected to a second node of the first resistor, and a second node coupled to a second reference voltage.

13. The memory device of claim 12 further comprising an enable circuit coupled to the resistor divider circuit for preventing current flow through the resistor divider circuit.

14. The memory device of claim 13 wherein the enable circuit comprises a transistor coupled between the second node of the second resistor and the second reference voltage connection.

15. The memory device of claim 11 further comprising an enable circuit coupled to the resistor divider circuit for preventing current flow through the resistor divider circuit.

16. The supervoltage circuit of claim 11 flrther comprising a test mode circuit connected to receive the output signal and initiate a test in response thereto.

17. A system comprising:
   a processor connected to a memory device for testing the memory device;
   the memory device comprising:
      an input for receiving an input voltage:
      a test mode circuit for initiating a test in response to the input voltage; and
      a supervoltage circuit comprising:
         a reference voltage circuit for producing a reference voltage,
         a resistor divider input circuit connected to the input for receiving the input voltage and producing an output voltage, and
         a compare circuit coupled to the test mode circuit for comparing the reference voltage and the output voltage and producing an output signal in response thereto.

18. A method of initiating a test operation in an integrated circuit device, the method comprising the steps of:
   providing a voltage on an input connection;
   generating an internal voltage using a resistor divider circuit coupled to the input connection;
   comparing the internal voltage to a reference voltage;
   producing an output signal when the internal voltage exceeds the reference voltage by a predetermined level; and initiating a test operation in response to the output signal.

19. The method of claim 18 further comprising the step of:

enabling the integrated circuit device to allow current flow through the resistor divider circuit.

20. A method of reducing effects of environmental and fabrication variables on integrated circuit testing, the method comprising the steps of:

receiving an input signal having a first voltage level on an input node;

processing the input voltage through a divider circuit to generate an intermediate signal having a second lower voltage level on an internal node, the divider circuit comprising first and second halves connected in series, the first half is connected between the input node and the internal node, and the second half is connected between the internal node and a bias voltage node, the first and second halves of the divider circuit each have an equal number and type of electrical components;

comparing the intermediate signal to a reference voltage;

producing an output signal when the intermediate signal exceeds the reference voltage by a predetermined level; and initiating a test operation in response to the output signal.

21. A method of reducing effects of fabrication variables on integrated circuit testing, the method comprising the steps of:

providing a test detection circuit having a diode-less voltage divider circuit;

receiving an input signal having a first voltage level;

producing an internal signal having a second voltage level; and initiating a test sequence if the second voltage level is a predetermined level.

* * * * *